(12) United States Patent
Shim et al.

(10) Patent No.: US 6,875,634 B2
(45) Date of Patent: Apr. 5, 2005

(54) HEAT SPREADER ANCHORING AND GROUNDING METHOD AND THERMALLY ENHANCED PBGA PACKAGE USING THE SAME

(75) Inventors: Il Kwon Shim, Singapore (SG); Hermes T. Apale, Singapore (SG); Weddie Aquien, Singapore (SG); Dario Filoteo, Singapore (SG); Virgil Ararao, Singapore (SG); Leo Merilo, Singapore (SG)

(73) Assignee: ST Assembly Test Services PTE LTD, Singapore (SG)

( * ) Notice: Subject to any disclaimer, the term of this patent is extended or adjusted under 35 U.S.C. 154(b) by 0 days.

(21) Appl. No.: 10/804,732

(22) Filed: Mar. 18, 2004

(65) Prior Publication Data

US 2004/0180525 A1 Sep. 16, 2004

Related U.S. Application Data

(62) Division of application No. 10/055,094, filed on Jan. 23, 2002, now Pat. No. 6,737,298.

(51) Int. Cl.[7] .......................... H01L 21/44; H01L 21/48; H01L 21/50

(52) U.S. Cl. .................... 438/108; 438/119; 438/122
(58) Field of Search ................. 438/108, 119, 438/122, FOR 413

(56) References Cited

U.S. PATENT DOCUMENTS

| 5,933,709 | A | * | 8/1999 | Chun | 438/122 |
| 6,093,584 | A | * | 7/2000 | Fjelstad | 438/127 |
| 6,218,214 | B1 | * | 4/2001 | Panchou et al. | 438/108 |
| 6,423,576 | B1 | * | 7/2002 | Hoffman | 438/118 |
| 6,538,320 | B1 | * | 3/2003 | Tosaya et al. | 257/706 |

* cited by examiner

Primary Examiner—George Fourson
Assistant Examiner—Michelle Estrada
(74) Attorney, Agent, or Firm—Mikio Ishimaru (57) ABSTRACT

A method and assembly are provided for anchoring the heat spreader of a PBGA package to the substrate thereof as part of the PBGA package. These anchor features are provided over the surface of the substrate of the PBGA package. The anchor features align with openings created in the heat spreader stand-off, thus allowing for quick and reliable positioning and anchoring of the heat spreader over the surface of the substrate of the package.

21 Claims, 8 Drawing Sheets

Step 1

FIG. 7a

Step 2

FIG. 7b

Step 3

FIG. 7c

Step 4

Step 1

FIG. 8a

Step 2

FIG. 8b

Step 3

HEAT SPREADER ANCHORING AND GROUNDING METHOD AND THERMALLY ENHANCED PBGA PACKAGE USING THE SAME

BACKGROUND OF THE INVENTION

This is a divisional of application Ser. No. 10/055,094 filed Jan. 23, 2002 now U.S. Pat. No. 6,737,298, which is hereby incorporated by reference herein.

BACKGROUND OF THE INVENTION (1) Field of the Invention

The invention relates to the fabrication of integrated circuit devices, and more particularly, to a method and package for anchoring and grounding of a heat spreader that is used as part of a thermally enhanced Plastic Ball Grid Array (PBGA) package.

(2) Description of the Prior Art

The semiconductor industry has since its inception achieved improvements in the performance of semiconductor devices by device miniaturization and by increasing the device packaging density.

One of the original approaches that has been used to create surface mounted, high pin count integrated circuit packages has been the use of the Quad Flat Pack (QFP) with various pin configurations. For the QFP, closely spaced leads along the four edges of the flat package are used for making electrical connections from where the electrical connections are distributed to the surrounding circuitry. The input/output (I/O) connections that can be made to the QFP are therefore confined to the edges of the flat package, which limits the number of I/O connections that can be made to the QFP even in applications where the pin to pin spacing is small. The QFP has found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package thereby eliminating the restriction of having I/O connects only around the periphery of the package. More contact points with greater spacing between the contact points can therefore be allocated across the BGA package than was the case with the QFP. The contact points that are used for the BGA package are typically solder balls that have the added advantage of facilitating flow soldering of the package onto a printed circuit board.

Prior Art substrate packaging uses ceramic and plastic BGA packaging. Ceramic substrate packaging is expensive and has proven to limit the performance of the overall package. Recent years have seen the emergence of plastic BGA packaging; this packaging has become the main stream design and is frequently used in high volume BGA package fabrication. The Plastic substrate BGA (PBGA) package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

The invention addresses concerns of heat spreader anchoring and grounding of thermally enhanced PBGA packages that in addition provides advantages of electrical performance and advantages of assembly while the package meets conventional manufacturing standards.

U.S. Pat. No. 5,616,957 (Kajihari) shows a package with an anchored heat spreader.

U.S. Pat. No. 5,977,626 (Wang et al.) reveals a thermally enhanced PBGA and heat spreader design.

U.S. Pat. No. 6,032,355 (Tseng et al.) and U.S. Pat. No. 5,710,459 (Tang et al.) show other heat spreaders.

SUMMARY OF THE INVENTION

A principle objective of the invention is to provide improved anchoring and positioning of a heat spreader onto the substrate of the PBGA package by the use of preformed anchoring posts on the surface of the substrate.

Another objective of the invention is to provide for accurate placement of the heat spreader over the surface of the substrate.

Yet another objective of the invention is to provide for improved planarity of the heat spreader and the therewith associated substrate, thereby avoiding mold flashing or bleeding into exposed portions of the heat spreader.

A still further objective of the invention is to provide a method that prevents direct grounding between a ground pad on the surface of the substrate of the package and a lower surface of the heat spreader of the package.

In accordance with the objectives of the invention a new method and assembly is provided for anchoring the heat spreader of a PBGA package to the substrate thereof. Anchor features are made part of the PBGA package, these anchor features are provided over the surface of the substrate of the PBGA package. The anchor features align with openings created in the heat spreader stand-off, thus allowing for quick and reliable positioning and anchoring of the heat spreader over the surface of the substrate of the package.

DESCRIPTION OF THE PREFERRED EMBODIMENTS

For purposes of clarity and reference, a prior art heat spreader interconnect methodology for thermally enhanced PBGA package will first be discussed using the cross section shown in FIG. 1. For applications where the die-up method of mounting is applied and where the device does not meet thermal requirements, the die-down method is frequently used whereby substrates are used that have been provided with metal heat-distribution surfaces (heat slugs). A die-down BGA package typically has better thermal performance than the die-up PBGA package, since the heat that is generated in the die can be dissipated effectively from the backside of the die to the metal heat slugs. However, the assembly cost for this die-down arrangement is considerably higher than for the die-up method of mounting semiconductor devices.

Figure 1:
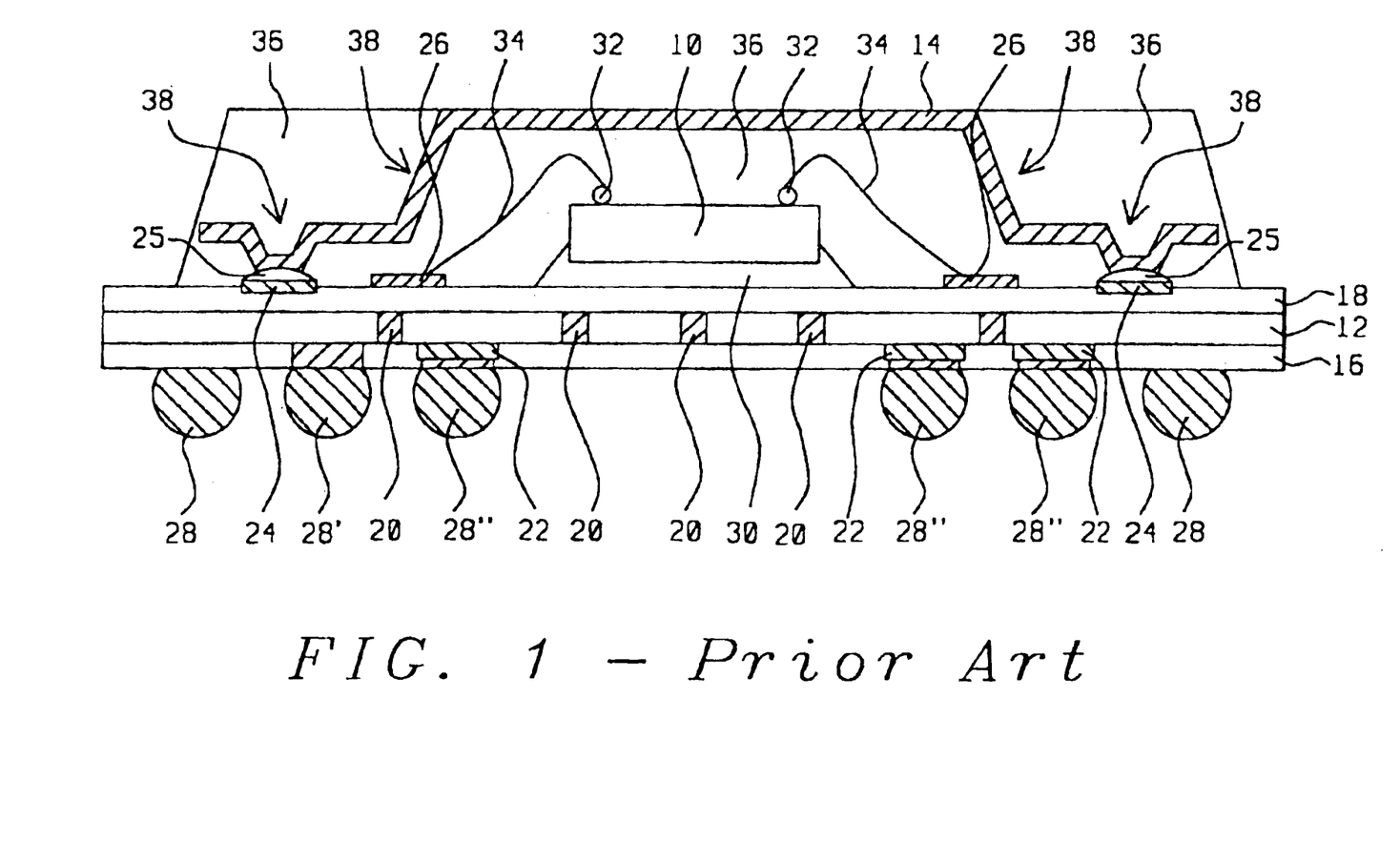
FIG. 1 is a cross section of a conventional PBGA package.

Shown in the cross section of FIG. 1 are the following elements of a die-up thermally enhanced PBGA package:

10, the semiconductor die of the thermally enhanced PBGA package, mounted over the surface of substrate 12

12, a substrate or semiconductor die mounting support; it must be understood that conventionally substrate 12 is used for the creation of multiple, complex and overlying layers of interconnect traces; these interconnect traces have not been highlighted in the cross section of FIG. 1 and essentially connect contact points or contact pads that are provided over a first surface of substrate 12 with contact points or contact pads that are provided over a second surface of substrate 12; examples of contact pads over a first surface of substrate 12 have been provided with contact pads highlighted as 22, examples of contact pads over a second surface of substrate 12 have been provided with contact pads highlighted as 24 and 26

14, the heat sink of the package 16, a first solder mask layer, typically comprising a patterned and etched layer of dielectric, with openings that align with the contact pads 22; first solder mask 16 is created over a first surface of substrate 12

18, a second solder mask layer, typically comprising a patterned and etched layer of dielectric, with openings that align with the copper traces 24; second solder mask 18 is created over a second surface of substrate 12

20, interconnect vias provided through substrate 12, creating electrical interconnects between contact pads on a first surface of substrate 12 and contact pads on a second surface of substrate 12

22, conductive traces or contact pads on a first surface of substrate 12; conductive traces 22 are connected to traces 26 by means of vias 20 or by means of other interconnect traces (not shown) that are part of the substrate 12

24, ground pads provided over a second surface of substrate 12; these ground pads 24 are the physical interfaces between the heat spreader 14 and the substrate 12

25, adhesive glue that is conventionally provided over the surface of ground pads 24 for positioning and interfacing with the heat spreader 14

26, contact points provided over the second surface of substrate 12

28, solder balls for further interconnect (not shown) of the package that is shown in cross section in FIG. 1 with surrounding electrical circuitry or electrical components (not shown); of the solder balls that are shown in the cross section of FIG. 1, it must be noted that some of these solder balls, such as solder ball 28, do not penetrate through the layer 16 and therefore do not make direct electrical contact with points of electrical contact provided in or on the first surface of substrate 12; other solder balls, such as solder ball 28', completely penetrate through the solder mask 16 and therefore makes contact with conductive traces over the surface of the substrate 12; other solder balls again, such as solder balls 28", partially penetrate through the solder mask 16 and make contact with contact pads 22 provided over a first surface of substrate 12

30, a layer of thermally conductive adhesive interfacing between die 10 and the second surface of substrate 12

32, points of electrical contact provided over the active surface of semiconductor die 10

34, bond wires for the interconnection of die 10 to contact pads 26 provided over a second surface of substrate 12

36, a mold compound formed over the surface of the structure, which further also surrounds bond wires 34.

Conventional methods that are applied for the improvement of thermally enhanced PBGA packages concentrate on:

increasing the density of the copper that is used in the creation of the substrate of the package including an increasing number of metal layers in the substrate of the package applying methods of enhanced integration of the heat spreader of the package into the package, typically using an adhesive for this purpose increasing the thickness of the metal layers in the substrate of the package, and adding more thermally conductive parts, vias and solder balls to the substrate of the package, specifically to surface areas of the substrate that align with the thereover mounted semiconductor die of the package.

Specifically highlighted in the cross section of FIG. 1 are the heat spreader standoff features 38 of the heat spreader, which form the surfaces and method of interfacing the heat spreader 14 with the substrate 12 of the PBGA package. Heat spreader 14 may comprise metal of may comprise thermally conductive epoxy.

Figure 2:
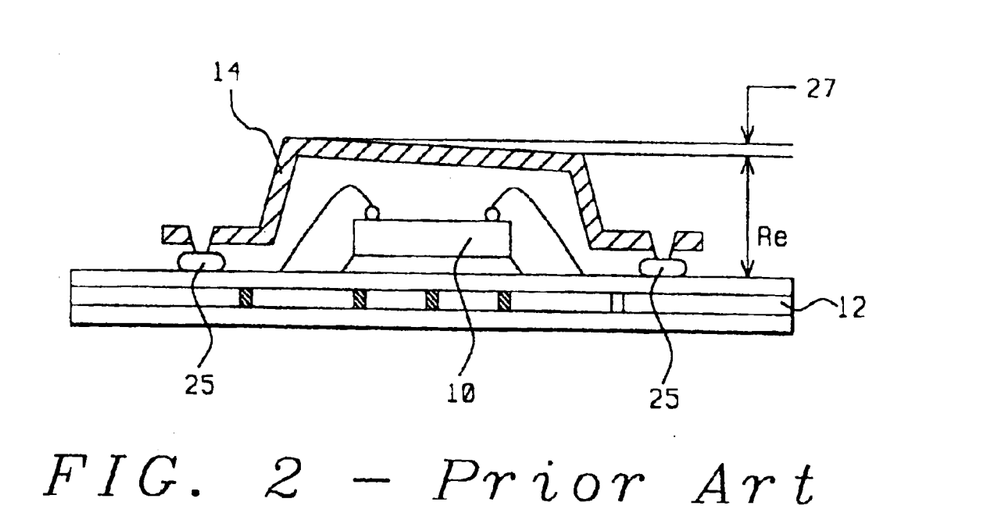
FIG. 2 shows a cross section of a conventional method of connecting a heat spreader to a substrate.

One of the commonly experienced problems using a PBGA package that has been shown in cross section in FIG. 1 is highlighted in the cross section of FIG. 2. Specifically highlighted in the cross section of FIG. 2 are:

25, the adhesive glue, which may be conductive or non-conductive, that is, as previously indicated, provided over the surface of the ground pads on which the heat spreader rests 27, a degree of non-planarity, which conventionally is encountered in the surface of heat spreader 14 due to a number of influences of stress and lack of planarity of supporting surfaces in addition to thermally introduced stress in the heat spreader. In the presence of the non-planarity 27 it is to be expected that uneven stress is present in the contact points 25 between the heat spreader 14 and the underlying ground pads 24 (FIG. 1), causing mold flashing or bleeding of the mold compound. In the absence of an even joining, a joining that must be alike for both intersects between the heat spreader 14 and the adhesive glue 25, the mold 36, FIG. 1, surrounding the semiconductor device 10 and the heat spreader 14 is prone to be not evenly distributed surrounding the die 16 and the heat spreader and can significantly escape from under the heat spreader 14 and spread out over the surrounding substrate 12.

Figure 3:
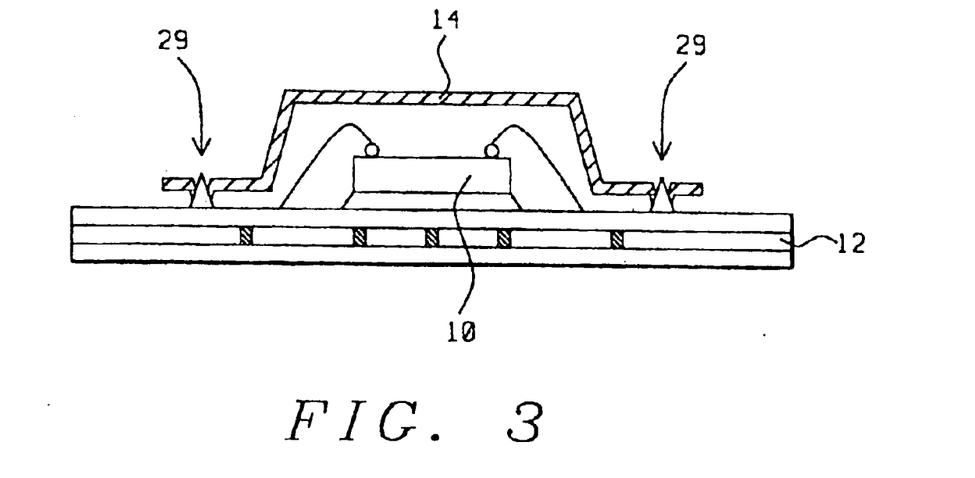
FIG. 3 shows a cross section of the method of the invention of connecting a heat spreader to a substrate.

FIG. 3 is a cross section that shows contact points 29, the contact points of the invention, between the heat spreader 14 and the underlying substrate 12. The main reason for showing the cross section of FIG. 3 is to highlight that the non-planarity 27, FIG. 2, of the conventional method of mounting the heat spreader has been eliminated using contact points 29 of the invention. This will be explained in detail following. The application of contact points 29 must concurrently provide for openings in the lower portions of the heat spreader stand-off 38 where the heat spreader stand-off 38 interfaces with the underlying substrate 12. In the absence of such openings, the contact points 29 would be of little value since the absence of such openings would inhibit the penetration of contact points 29 into the stand-off 38 of the heat spreader.

The contact points 29, also referred to as anchor posts, can be created using epoxy to which traces of silver have been added or solder paste or a solid metal.

Figure 4:
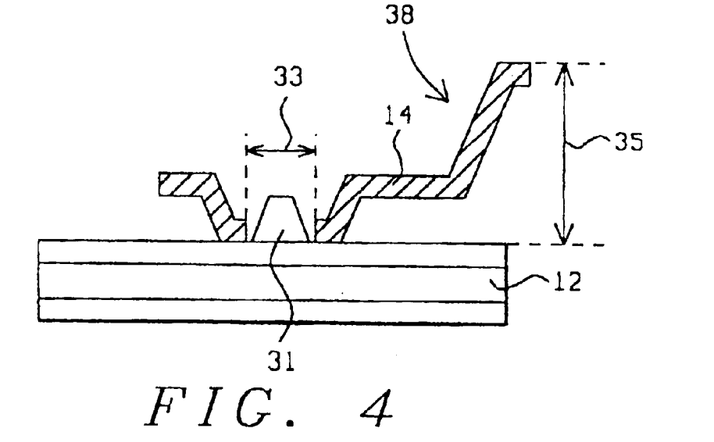
FIG. 4 shows a cross section providing detail of the anchoring feature of the invention of connecting a heat spreader to a substrate.

FIG. 4 shows a cross section of the section 38, FIG. 1, the heat spreader standoff of the heat spreader 14, which highlights:

- a first surface of the heat spreader 14 is seated directly over a second surface of the substrate 12
- no adhesive glue is provided in the interface between the heat spreader 14 and substrate 12
- the heat spreader stand-off 38, and therewith the heat spreader 14, is seated over the second surface of substrate 12 by means of a positioning and anchoring post 31 that is pre-formed over the surface of substrate 12
- anchoring post 31 is centered with respect to and inserted through an opening 33 that has been provided for this purpose in the heat spreader stand-off 38
- 35 highlights the consistent seating height of the heat spreader 14, which is made possible by the direct contact between the heat spreader stand-off post 38 and the substrate 12, without any intervening layers of glue, paste and the like.

Figure 5:
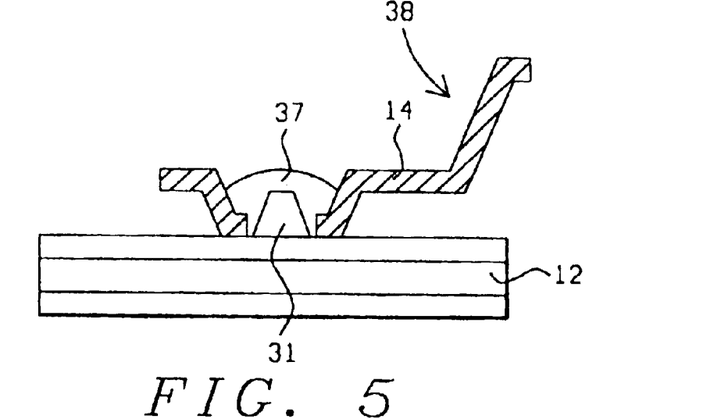
FIG. 5 shows a cross section of the anchoring feature of the invention, whereby optionally a layer of thermally conductive material is provided.

FIG. 5 shows a cross section that is identical to the cross section of FIG. 4 with exception of the addition of an optional layer 37 of electrically and/or thermally conductive material. This optional layer 37 provides for firmer seating and locking of the standoff 38. In addition, layer 37 enhances thermal conduction from the heat spreader 14 to the substrate 12.

This optional layer 37 can be deposited using a material such as epoxy to which traces of silver have been added or solder paste or a solid metal.

Figure 6A:
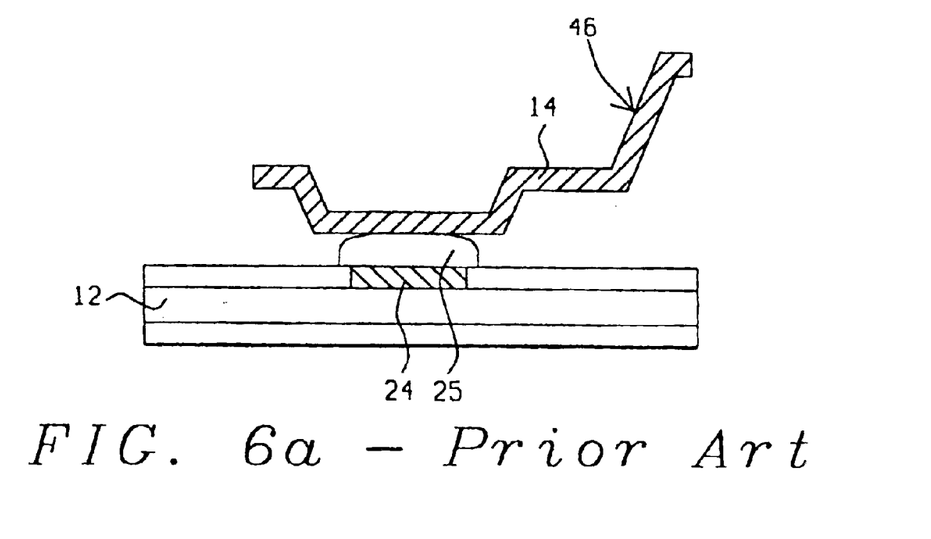
FIG. 6a shows a cross section of the conventional method of securing a heat spreader over a substrate.

The cross section of FIG. 6a shows a conventional electrically conductive path between the heat spreader 14 and the underlying substrate 12, as follows:

- from a second surface 46 of the heat spreader 14 to
- the conductive glue 25 to
- the metal ground pad 24 to (not shown)
- a ground-ring that is conventionally provided as a component of substrate 12.

Figure 6B:
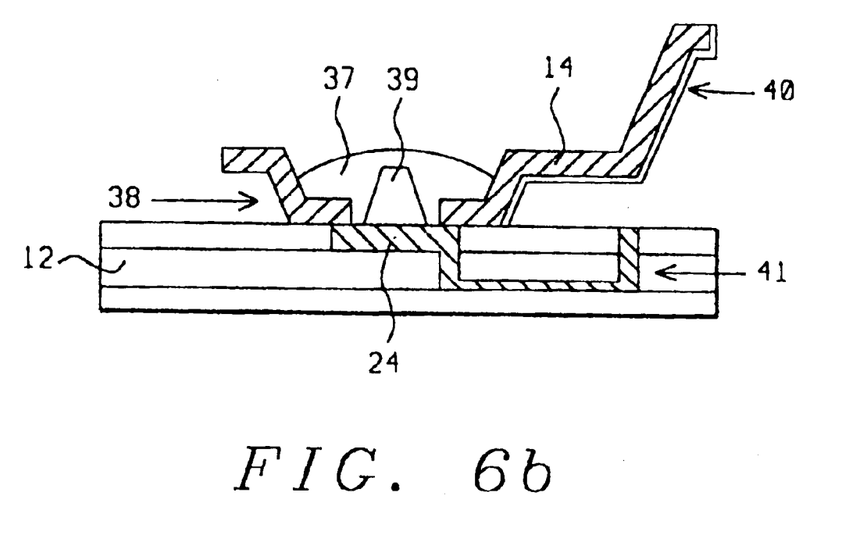
FIGS. 6b through 6c show examples of the method of the invention of anchoring a heat spreader over the surface of a substrate, the substrates of the two representations are different.
Figure 6C:
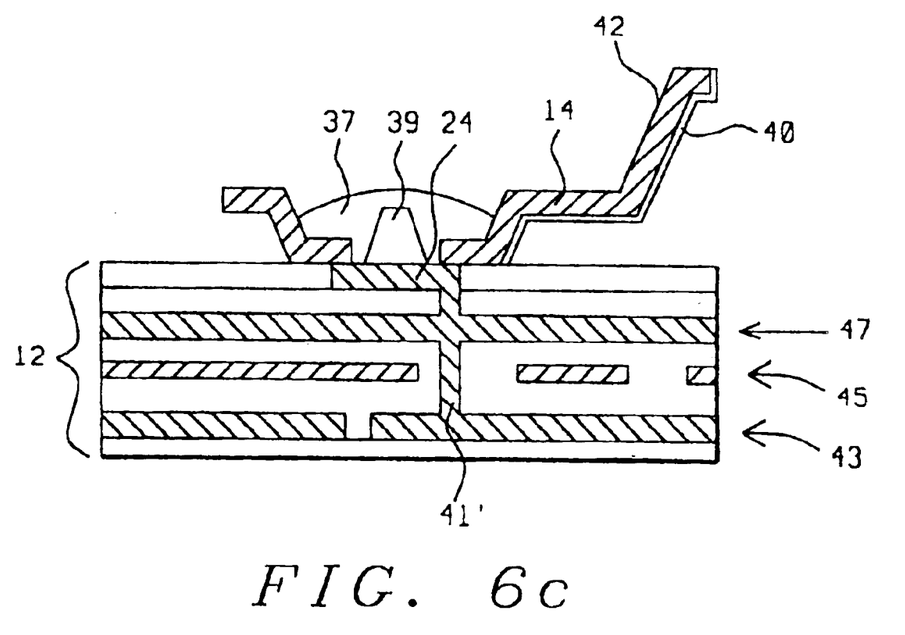

FIGS. 6b and 6c provide further detail regarding the heat spreader anchoring of the invention by highlighting the following elements of this arrangement:

14, the heat spreader, this heat spreader may be created using metal over the surface of which is coated a layer of nickel or therewith electrically and thermally equivalent material 39, the conductive anchor of the invention; this anchor is preformed over the surface of the metal ground pad 24 and therewith over the surface of substrate 12; anchor 39 may be created using an epoxy to which traces of silver are added or solder paste or a solid metal 38, the heat spreader stand-off 24, a metal ground pad that is connected to a ground plane; the ground plane may be provided in a second (or upper) surface of the substrate 12 or in an inner ground plane (not shown) for substrates that comprise multiple layers of interconnect metal 12, the substrate of the package 41, a plated through hole 40, a layer of a non-conductive material, created over the first surface of the heat spreader 14 by coating or by depositing or chemically a non-conductive material; this layer provides a first surface 40 of heat spreader 14 that is electrically non-conductive 37, a layer of electrically conductive material provided over the conductive anchor post 39, and 40, the non-conductive first surface of heat spreader 14.

FIG. 6c shows a cross section that further illustrates the use of a substrate 12 wherein multiple layers of conductive interconnects have been provided, specifically layers 43, 45 and 47, of which one or more may be used as signal interconnects or ground planes or power lines and the like. A plated through hole 41' has also been highlighted in the cross section of FIG. 6c.

Specifically, from the cross section that is shown in FIG. 6c it is clear that the path of electrical conduction for this cross section is as follows:

- from the second or upper surface 42 of the heat spreader 14 to
- the conductive material (not shown) deposited over the second surface of heat spreader 14 to
- 37, the layer of conductive material deposited over the anchor 39 to
- the conductive anchor 39, the anchor posts of the invention, comprising conductive material, that have been created over the first surface of heat spreader 14 to
- the ground pad 24 to
- plated through hole 41' to
- a thermally conductive layer, such as layer 43, provided as a layer of substrate 12.

FIGS. 7a through 7g and 8a through 8f are provided to show the heat spreader attach processing steps of the invention before the molding is applied, these two sets of figures are differentiated as follows:

FIGS. 7a through 7g show the indicated flow, implemented by enhancing the die attach machine, and FIGS. 8a through 8f show the indicated flow, implemented by enhancing the conventional die heat spreader attach machine.

Figure 7A:
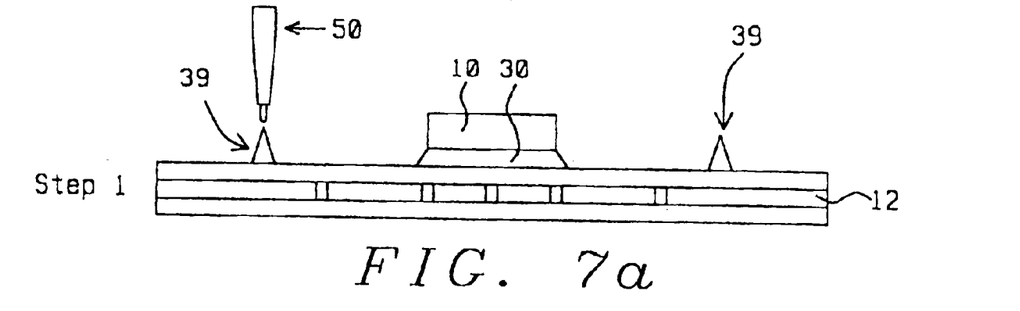
FIGS. 7a through 7g show a first flow of creating a PBGA package using the anchoring method of the invention, this first method incorporates enhancing the conventional die attach tool.

The processing flow that is shown in FIGS. 7a through 7g, which comprises enhancing the die attach machine, will be highlighted first, as follows:

1. FIG. 7a, step 1, anchor posts 39 (see also FIGS. 6a and 6b) are created at the time of die attach or after wire bonding, conductive epoxy is used for this purpose, dispensed through the dispensing needle 50; this cross section shows that the invention can be implemented by enhancing the die attach machine such that the die attach machine can, in addition to and simultaneous with depositing the layer 30 of thermally conductive adhesive (epoxy) interfacing between die 10 and the second surface of substrate 12, also deposit conductive epoxy 39

Figure 7B:
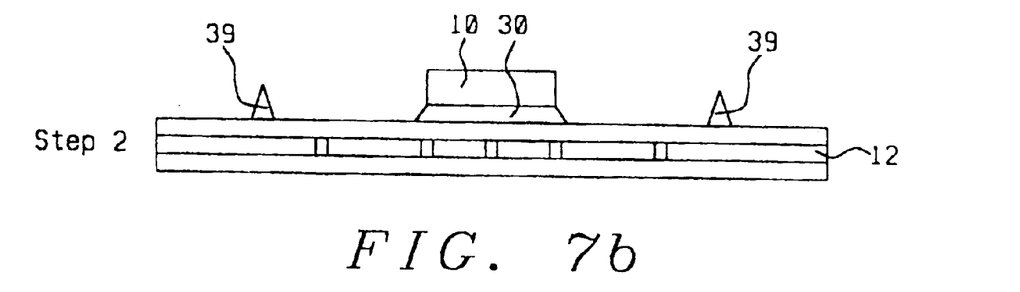
Figure 7C:
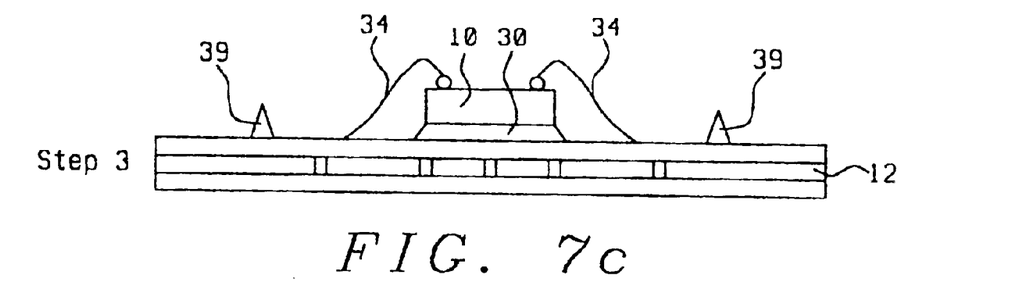

2. FIG. 7b, step 2, this is the step of curing the deposited conductive epoxy 39; this step of curing can be performed inline or as a batch over process 3. FIG. 7c, step 3, the wire bonding step, wires 34 are provided, these conductive wires interconnect contact points on the active surface of die 10 (not shown) with contact pads (not shown), similar to conductive pads 26 of FIG. 1, provided over the second surface of substrate 12

Figure 7D:
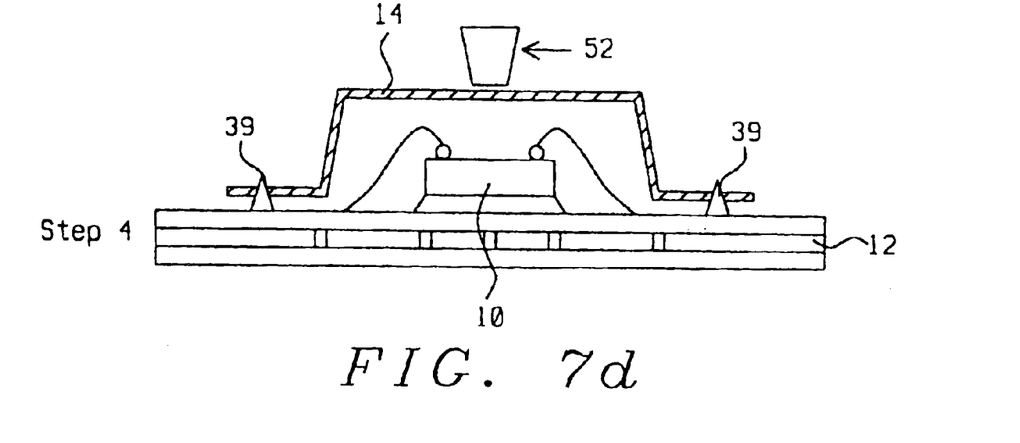

4. FIG. 7d, step 4, heat spreader 14 is attached as a first operation in a first station of the heat spreader attach tool, using for this purpose pick & place operation 52

Figure 7E:
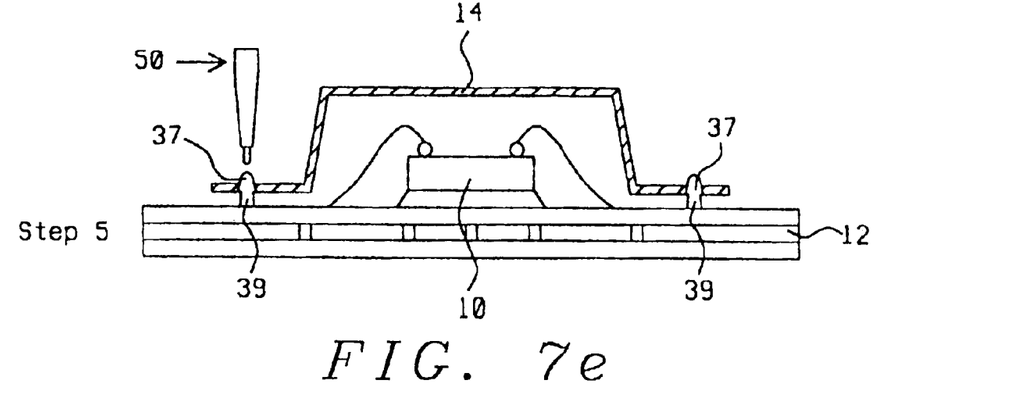
Figure 7F:
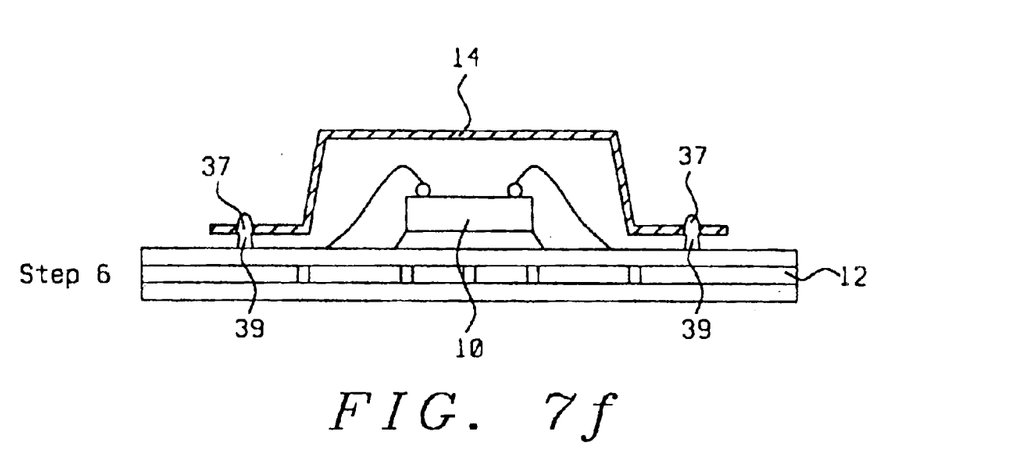
Figure 7G:
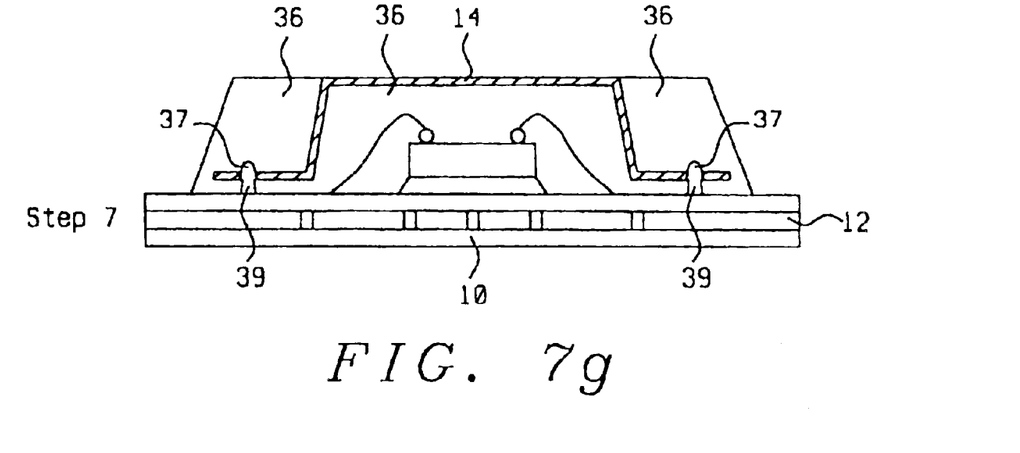

5. FIG. 7e, step 5, deposit a layer 37 (see also FIGS. 6b and 6c) of conductive epoxy over the surface of the cured epoxy 39, as a second operation in a second station of the heat spreader attach tool, using dispensing needle 50 for this purpose
6. FIG. 7f, step 6, perform epoxy cure, curing the deposited layer 37 of epoxy, and
7. FIG. 7g, step 7, complete the package of the invention by providing the molding 36 underneath and overlying the heat spreader 14.

Figure 8A:
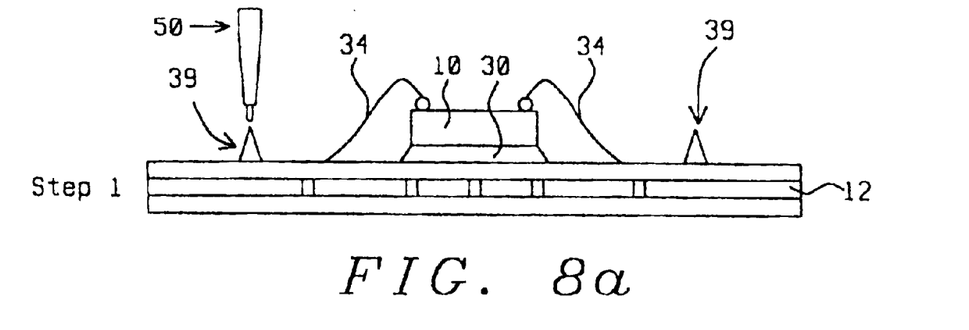
FIGS. 8a through 8f show a second flow of creating a PBGA package using the anchoring method of the invention. This second method incorporates enhancing the conventional beat spreader attach tool.
Figure 8B:
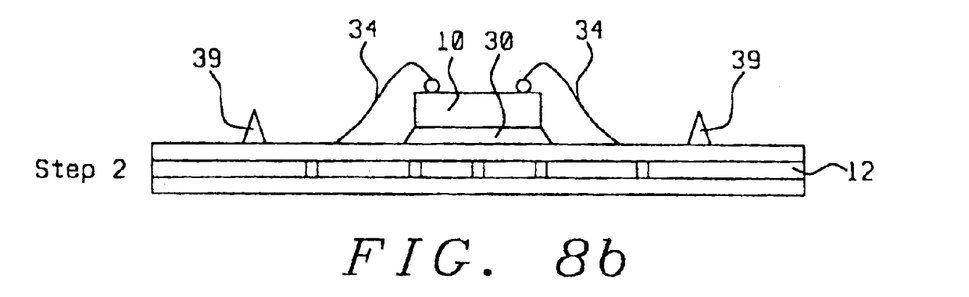
Figure 8C:
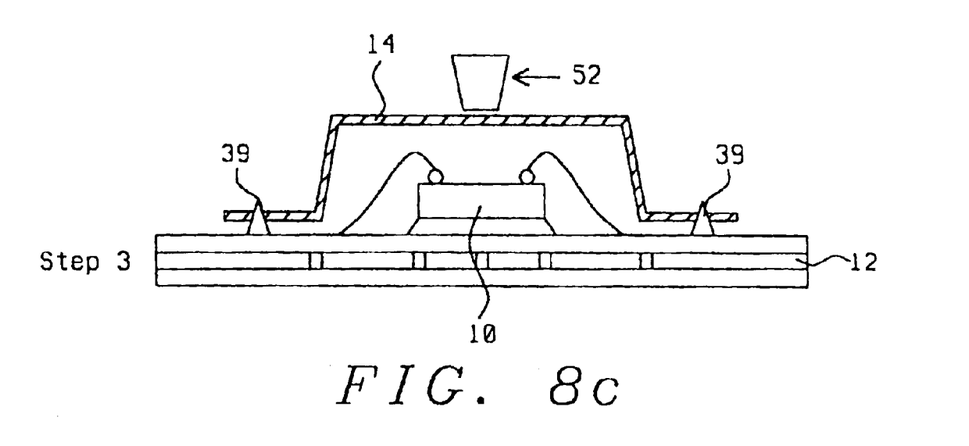
Figure 8D:
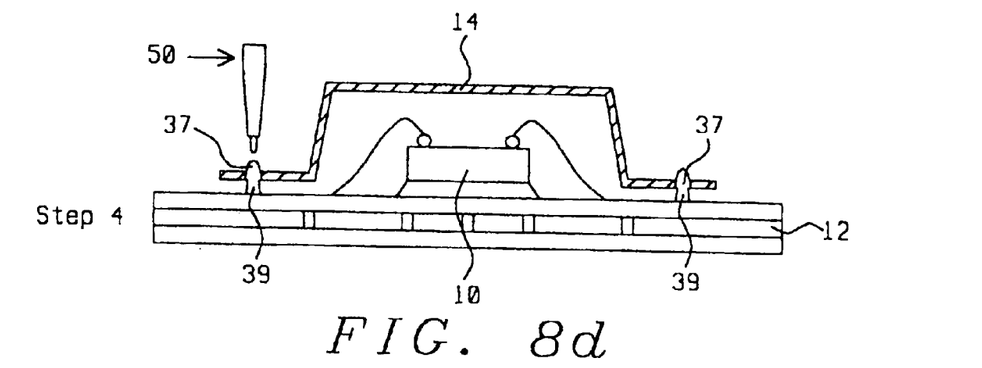
Figure 8E:
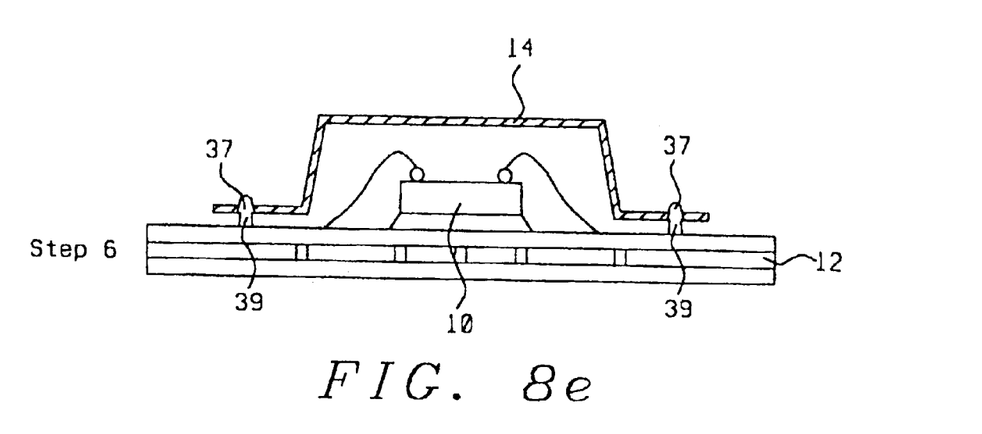
Figure 8F:
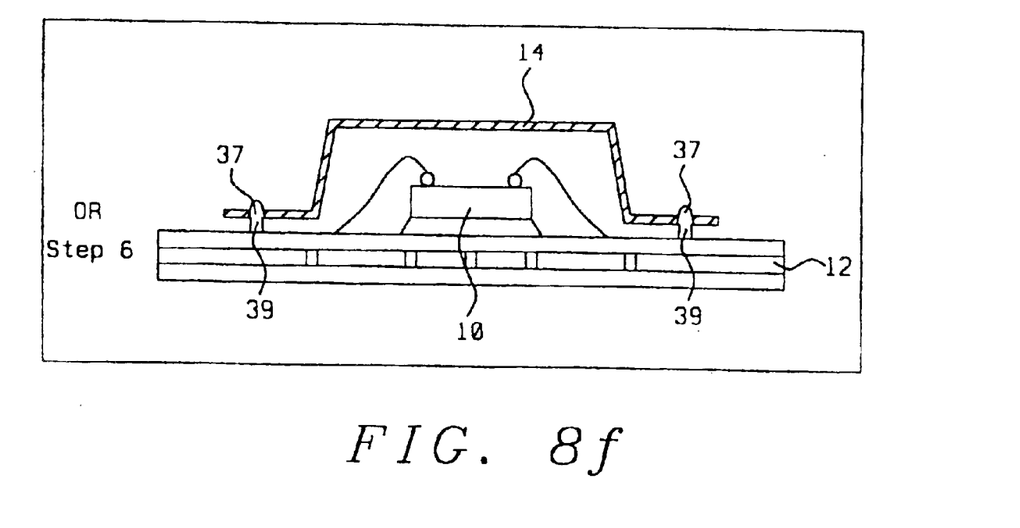

The processing flow that is shown in FIGS. 8a through 8f, which comprises enhancing the conventional die heat spreader attach machine, will be highlighted next, as follows:

1. FIG. 8a, step 1, anchor post 39 (see also FIGS. 6a and 6b) is created at the time of wire bonding or after wire bonding, conductive epoxy is used for this purpose, dispensed through the dispensing needle 50; it must be noted in the cross section that is shown in FIG. 8a, step 1, that the bond wires 34 are present at the time that the conductive epoxy is deposited; this reflects the fact that for the flow that is shown in FIGS. 8a and 8b, the conventional die attach machine is not modified and therefore performs only the die attach operation which is conventionally followed by wire bond connect 34, providing the cross section that is shown in FIG. 8a, step 1
2. FIG. 8b, step 2, this is the step of curing the deposited conductive epoxy 39; this step of curing is a quick or snap cure that can be performed in-line
3. FIG. 8c, step 3, heat spreader 14 is attached as a first operation in a first station of the heat spreader attach tool, using for this purpose pick & place operation 52
4. FIG. 8d, step 4, deposit a layer 37 (see also FIGS. 6b and 6c) of conductive epoxy over the surface of the cured epoxy 39; this cross-section shows that the invention can be implemented by enhancing the heat spreader attach machine such that the heat spreader attach machine can, in addition to and following the placement of the heat spreader 14, also deposit conductive epoxy 37
5. FIG. 8e, step 5, perform epoxy cure, curing the deposited layer 37 of epoxy, which can be performed in-line or, step 6
6. FIG. 8f, step 6, perform epoxy cure, curing the deposited layer 37 of epoxy, which can be performed off-line as a batch type oven curing process, and (not shown)
7. complete the package of the invention by providing molding underneath and overlying the heat spreader.

The invention can be summarized as follows:

the invention provides an improved method of positioning and anchoring of the heat spreader with respect to the underlying substrate by using pre-formed anchoring posts the anchoring posts of the invention provide for improved accuracy in the placement of the heat spreader over the substrate the anchoring posts of the invention provide for improved planarity of the surface of the heat spreader with respect to the surface of the underlying substrate the invention provides for the prevention of mold flashing or bleeding by preventing that the mold can escape along the (exposed) surface of the heat spreader the invention provides for avoiding direct electrical shorting between a ground pad, provided over the surface of the underlying substrate, and the heat spreader since the first or lower surface of the heat spreader is provided with a layer of non-conductive material the invention provides for a direct interconnecting conductive path between a second or upper surface of the heat spreader and a ground plane provided as one of the planes of the underlying substrate; a ground pad provided over the second or upper surface of the substrate provides a direct electrical interface between the heat spreader and the substrate, from where the ground connection can be completed with interconnecting conductive posts between the ground pad and a ground plane of the substrate.

The processing flows that have been shown in FIGS. 7a through 7g and 8a through 8f can be summarized as follows:

FIGS. 7a through 7g, enhancing the conventional die attach machine, implemented by the sequence:
1. die attach
2. anchor post creation
3. curing of the created anchor posts
4. wire bonding
5. attaching the heat spreader
6. depositing of epoxy over the created anchor (optional)
7. curing the epoxy deposited over the anchor posts, and
8. providing the mold compound, enclosing the mounted semiconductor die and partially overlying the heat spreader.

FIGS. 8a through 8f, enhancing the conventional heat spreader attach machine, implemented by the sequence:
1. performing conventional steps of die attach and wire bonding
2. creating the anchor posts of the invention
3. curing the created anchor posts (in-line, snap curing)
4. attaching the heat spreader
5. depositing of epoxy over the created anchor posts (optional),
6. curing the epoxy deposited over the anchor posts, and
7. providing the mold compound, enclosing the mounted semiconductor die and partially overlying the heat spreader.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a Plastic Ball Grid Array (PBGA) package, comprising the steps of:
 (a) providing a PBGA substrate having points of electrical contact over the surface thereof, a layer of thermally conductive adhesive having been provided over the surface of said substrate, at least one semicoductor device having been positioned over the surface of said layer of thermally conductive adhesive using a die attach process, said positioning of said at least one conductor device being performed such that contact points provided in an active surface of said at least one semiconductor device being exposed and facing away from the surface of said substrate;
 (b) creating anchor posts over the surface of said substrate, said anchor posts being separated by a first distance;
 (c) curing said created anchor posts;
 (d) electrically connecting said contact points provided in an active surface of said at least one semiconductor device with said points of electrical contact provided over the surface of said substrate, using methods of wire bonding;
 (e) providing a heat spreader for said PBGA package, said heat spreader having a first and a second surface, said first surface facing said substrate, said first surface having been provided with a layer of electrically non-conductive material, said heat spreader comprising:
  (i) a horizontal portion, being parallel with the surface of said substrate of said PBGA package;
  (ii) heat spreader stand-off features;

(iii) said heat spreader stand-off features having a contact surface providing contact between said heat spreader and said substrate;

(iv) said contact surface of said heat spreader stand-off features having been provided with, openings therethrough; and (v) said openings provided through said contact surfaces being separated by a distance of said first distance;

(f) aligning said anchor posts provided over the surface of said substrate with said openings provided through said contact surfaces of said stand-off features of said heat spreader; and (g) inserting said anchor posts provided over the surface of said substrate into said openings provided through said contact surfaces of said stand-off features of said heat spreader, creating anchor posts protruding through said openings provided through said contact surfaces.

2. The method of claim 1, said anchor posts comprising deposits of thermally and electrically conductive material, said thermally and electrically conductive material having been cured after deposition thereof.

3. The method of claim 1, said anchor posts comprising deposits of thermally and electrically conductive material.

4. The method of claim 1, said anchor posts comprising a material selected from the group consisting of epoxy to which traces of silver have been added and solder paste and a solid metal.

5. The method of claim 1, said providing said first surface of said heat spreader with a layer of electrically non-conductive material comprising a method selected from the group consisting of coating and depositing and chemically treating the first surface of said heat spreader.

6. The method of claim 1, said anchor posts having been created applying methods is dispensing or printing of electrically and thermally conductive material.

7. The method of claim 6, said of electrically and thermally conductive material comprising epoxy to which traces of silver have been added.

8. The method of claim 1, with additional steps of:

depositing a layer of electrically and thermally conductive material over said anchor posts protruding through said openings provided through said contact surfaces, thereby including a surface area of said heat spreader surrounding said openings provided through said contact surfaces, thereby using methods of dispensing or printing; and curing said deposited layer of electrically and thermally conductive mateial.

9. The method of claim 8, said electrically and thermally conductive material comprising a material selected from the group consisting of epoxy to which traces of silver have been added and solder paste and a solid metal.

10. The method of claim 8, with additional steps comprising molding and encapsulation processes.

11. A method for creating a Plastic Ball Grid Array (PBGA) package, comprising the steps of:

(a) providing a PBGA substrate having points of electrical contact over the surface thereof, a layer of thermally conductive adhesive having been provided over the surface of said substrate, at least one semiconductor device having been positioned over the surface of said layer of thermally conductive adhesive using a die attach process, said positioning of said at least one semiconductor device being performed such that contact points provided in an active surface of said at least one semiconductor device being exposed and facing away from the surface of said substrate, said contact points provided in an active surface of said at least one semiconductor device having been electrically connected with said points of electrical contact provided over the surface of said substrate, using methods of wire bonding;

(b) creating anchor posts over the surface of said substrate, said anchor posts being separated by a first distance;

(c) curing said created anchor posts, applying methods of in-line or snap curing;

(d) providing a heat spreader for a PBGA package, said heat spreader having a first and a second surface, said first surface facing said substrate, said first surface having been provided with a layer of electrically non-conductive material said heat spreader comprising:

(i) a horizontal portion, being parallel with the surface of said substrate of said PBGA package;

(ii) heat spreader stand-off features;

(iii) said heat spreader stand-off features having a contact surface providing contact between said heat spreader and said substrate;

(iv) said contact surface of said heat spreader stand-off features having been provided with openings therethrough; and (v) said openings provided through said contact surfaces being separated by a distance of said first distance;

(e) aligning said anchor posts provided over the surface of said substrate with said openings provided through said contact surfaces of said stand-off features of said heat spreader, using methods of pick and place; and (f) inserting said anchor posts provided over the surface of said substrate into said openings provided through said contact surfaces of said stand-off features of said heat spreader, creating anchor posts protruding through said openings provided through said contact surfaces.

12. The method of claim 11, said anchor posts comprising deposits of thermally and electrically conductive material.

13. The method of claim 11, said anchor posts comprising a material selected from the group consisting of epoxy to which traces of silver have been added.

14. The method of claim 11, said anchor posts being created applying methods of solder bump creation.

15. The method of claim 11, said providing said first surface of said heat spreader with a layer of electrically non-conductive material comprising a method selected from the group consisting of coating and depositing and chemically treating the first surface of said heat spreader.

16. The method of claim 11, said anchor posts having been created applying methods is dispensing or printing of electrically and thermally conductive material.

17. The method of claim 16, said conductive material comprising epoxy to which traces of silver have been added.

18. The method of claim 11, with additional steps of:

depositing a layer of electrically and thermally conductive material over said anchor posts protruding through said openings provided through said contact surfaces, thereby including a surface area of said heat spreader surrounding said openings provided through said contact surfaces, thereby using methods of dispensing or printing; and curing said deposited layer of electrically and thermally conductive material.

19. The method of claim 18, said electrically and thermally conductive material comprising epoxy to which traces of silver have been added.

20. The method of claim 18, said electrically and thermally conductive material comprising solder paste.

21. The method of claim 18, with additional steps of molding and encapsulation processes.

* * * * *

UNITED STATES PATENT AND TRADEMARK OFFICE
CERTIFICATE OF CORRECTION

PATENT NO. : 6,875,634 B2  Page 1 of 1
APPLICATION NO. : 10/804732
DATED : April 5, 2005
INVENTOR(S) : Shim et al.

It is certified that error appears in the above-identified patent and that said Letters Patent is hereby corrected as shown below:

Column 2
    line 50, delete "FIGS. 6*b* through 6*c*" and insert therefor --FIGS. 6*b* and 6*c*--
    line 62, delete "beat spreader" and insert therefor --heat spreader--

Column 6
    line 5, delete "chemically a non-conductive material" and insert therefor
        --chemically treating the first surface of heat spreader 14 with a non-conductive
        material--

Column 8
    claim 1, line 44, delete "semicoductor" and insert therefor --semiconductor--
    claim 1, line 48, delete "conductor" and insert therefor --semiconductor--

Column 9
    claim 2, lines 18-21,
        delete "said anchor posts comprising deposits of thermally and electrically
            conductive material, said thermally and electrically conductive material
            having been cured after deposition thereof."
        and insert therefor --said anchor posts being created during said die attach
            process.--
    claim 8, line 47, delete "mateial." and insert therefor --material.--

Column 10
    claim 11, line 13, delete "material said" and insert therefor --material, said--

Signed and Sealed this

Twentieth Day of October, 2009

David J. Kappos
*Director of the United States Patent and Trademark Office*